US010163612B2

United States Patent
De Bosscher et al.

(10) Patent No.: US 10,163,612 B2
(45) Date of Patent: Dec. 25, 2018

(54) ONLINE ADJUSTABLE MAGNET BAR

(71) Applicant: SOLERAS ADVANCED COATINGS BVBA, Deinze (BE)

(72) Inventors: Wilmert De Bosscher, Drongen (BE); Ivan Van De Putte, Zulte (BE); Guy Gobin, Oostende (BE)

(73) Assignee: SOLERAS ADVANCED COATINGS BVBA, Deinze (BE)

( * ) Notice: Subject to any disclaimer, the term of this patent is extended or adjusted under 35 U.S.C. 154(b) by 683 days.

(21) Appl. No.: 14/378,383

(22) PCT Filed: Feb. 13, 2013

(86) PCT No.: PCT/EP2013/052913
§ 371 (c)(1),
(2) Date: Aug. 13, 2014

(87) PCT Pub. No.: WO2013/120920
PCT Pub. Date: Aug. 22, 2013

(65) Prior Publication Data
US 2016/0013034 A1  Jan. 14, 2016

(30) Foreign Application Priority Data
Feb. 13, 2012  (EP) .................... 12155246

(51) Int. Cl.
*H01J 37/34* (2006.01)
*C23C 14/35* (2006.01)

(52) U.S. Cl.
CPC .......... *H01J 37/3435* (2013.01); *C23C 14/35* (2013.01); *H01J 37/3405* (2013.01);
(Continued)

(58) Field of Classification Search
CPC ... C23C 14/35; H01J 37/3405; H01J 37/3435; H01J 37/3438; H01J 37/3455; H01J 37/3461
(Continued)

(56) References Cited

U.S. PATENT DOCUMENTS 4,500,408 A * 2/1985 Boys ...................... C23C 14/54
                                                         204/192.12
5,445,721 A   8/1995 Bower
(Continued)

FOREIGN PATENT DOCUMENTS

CN  1126770 A  7/1996
CN  1126771 A  7/1996
(Continued)

OTHER PUBLICATIONS

International Search Report for corresponding International PCT Application No. PCT/EP2013/052913, dated Jun. 25, 2013.

*Primary Examiner* — Rodney G McDonald
(74) *Attorney, Agent, or Firm* — Workman Nydegger

(57) ABSTRACT

An end-block for rotatably carrying a sputtering target tube and for rotatably restraining a magnet bar inside the sputtering target tube includes a receptacle for receiving a magnet bar fitting. The receptacle comprises a first part of a signal connector arranged to receive a second part of a signal connector from the magnet bar fitting, and allow a signal connector between the end-block and the magnet bar to be formed. The end-block is adapted for providing protection means to the signal connector for protecting it from degradation, destruction or interference of a power and/or data signal transmitted between the end-block and the magnet bar, due to surrounding cooling fluid and/or surrounding high energy fields. The disclosure provides a corresponding magnet bar, and a method for adjusting a magnetic configuration of a magnet bar in a cylindrical sputtering apparatus.

25 Claims, 4 Drawing Sheets

(52) U.S. Cl.
CPC ...... *H01J 37/3438* (2013.01); *H01J 37/3455* (2013.01); *H01J 37/3461* (2013.01)

(58) Field of Classification Search
USPC ........................................ 204/298.21, 298.22
See application file for complete search history.

(56) References Cited

U.S. PATENT DOCUMENTS

| | | |
|---|---|---|
| 5,518,592 A | 5/1996 | Bower et al. |
| 6,841,051 B2 | 1/2005 | Crowley |
| 8,500,976 B2 | 8/2013 | Goderis et al. |
| 2002/0096430 A1* | 7/2002 | Lupton ............... C23C 14/3407 204/298.12 |
| 2003/0136672 A1* | 7/2003 | Barrett ................ H01J 37/3435 204/298.22 |
| 2003/0173217 A1 | 9/2003 | Crowley |
| 2004/0149576 A1 | 8/2004 | Crowley |
| 2006/0207871 A1 | 9/2006 | Yumshtyk et al. |
| 2011/0062022 A1 | 3/2011 | Goderis et al. |

FOREIGN PATENT DOCUMENTS

| | | |
|---|---|---|
| DE | 4342766 A1 | 6/1995 |
| DE | 102009033546 A1 | 1/2011 |
| JP | 2003268538 A | 9/2003 |
| JP | 2011521101 A | 7/2011 |
| WO | 2009138348 A1 | 11/2009 |

\* cited by examiner

ONLINE ADJUSTABLE MAGNET BAR

FIELD OF THE INVENTION

The present invention relates to an end-block that is used for rotatably carrying a sputtering target in a sputtering apparatus. More particularly, the present invention relates to an end-block adapted for online adjustment of a magnet bar in a sputtering magnetron as used with rotatable targets in a sputtering apparatus for coating large areas, such as display coaters, large area glass coaters, web coaters or a similar kind of equipment.

BACKGROUND OF THE INVENTION

Physical vapour deposition by means of sputtering has become a standard technique to customise the properties of for example glass panes or other rigid or flexible materials. 'Sputtering' refers to the ballistic ejection of coating material atoms out of a target by means of positively charged ions, —usually argon—that are accelerated by an electric field towards a negatively charged target. The positive ions are formed by impact ionisation in the low pressure gas phase. The ejected atoms impinge on the substrate to be coated where they form a dense, well adhering coating.

The ionisation of the gas forming the ions is confined close to the surface of the target by means of a magnetic field generated from behind the target surface and exhibiting an arc shaped, closed loop tunnel at the surface of the target. During operation, electrons bounce back and forth along those magnetic field lines while drifting down the closed loop thereby increasing the impact ionisation probability of the gas atoms. A plasma glowing closed loop 'race track' forms at the surface of the target.

It remains an engineering challenge when one wants to use cylindrical, rotating targets instead of the easier to implement planar stationary targets. When using the latter, the coolant supply (the target must be cooled as the impact of the positive ions heats up the target) and electrical energy supply can be done to a fixed target assembly. When using rotating targets the coolant and electric supply must be rotational compliant while maintaining vacuum integrity. However, the benefits of succeeding in this challenge are worth the effort as rotatable targets carry much more usable target material stock than planar targets do. Also rotatable targets are less prone to arcing compared to their planar counterparts. These advantages are particularly appreciated in inline coaters wherein substrates pass by the elongated, cylindrical target in a direction perpendicular to the axis of the target. In order to maintain even coating thicknesses across the substrate a uniform sputter rate of target material is needed over the length of the target.

One of the engineering problems one is faced with is that the magnetic field generator must be contained in the target. The magnetic field generator—oriented towards the substrate to be coated—is usually held stationary while the cylindrical target rotates in front of it. High performance permanent magnets based on iron neodymium boron (Fe—Nd—B) or cobalt samarium (Co—Sm) alloys are used to generate the magnetic field. As the component of the magnetic field parallel to the surface of the target is determining the confinement of the electrons in the plasma it is important that this component is controlled along the length of the tube. Unfortunately, the magnetic induction (in tesla) of this component normally drops with at least the second power of the distance to its generator and hence is very sensitive to the position of the magnetic field generator with respect to the target surface. The distance between the target surface and the magnetic field generator must therefore be well controlled as otherwise the plasma would show local variations in intensity that in their turn can lead to non-uniform coating profiles across the substrate.

WO 2009/138348 discloses a solution to the problem of controlling the distance between the target surface and the magnetic field generator: an adjustable mounting of the magnetic field generator makes it possible to adjust the distance between the magnetic field generator and the tube outer wall. In this publication, adjustment of the distance of the magnetic field generator with respect to the outer wall of the tube is enabled by discrete supports distributed over the length of the tube, which discrete supports may be made longer or shorter depending on the needs. Mechanical systems may be used thereto, such as for example introduction of shims or washers over a screw that holds the support in place to increase the overall length of the support, or introduction of an adjustment screw in the support where the screw turns in a threading fixedly connected to the tube while the end of the screw is axially held by a holder connected to the generator in which it can freely turn.

It is a disadvantage of the teaching of the above publication that the magnetron has to be opened, hence the vacuum has to be removed, in order to allow for adjustments, and after the adjustment has been carried out, the vacuum has to be re-applied. This is very time consuming.

SUMMARY OF THE INVENTION

It is an object of embodiments of the present invention to provide a good method and a device for allowing signal transmission between an end-block and a magnet bar of a sputtering installation, despite the harsh environment. The present invention realizes the possibility of online adjustment of magnetic field strength in a sputtering apparatus, during sputtering and without the need for removing the vacuum from the sputtering apparatus.

The above objective is accomplished by a method and device according to embodiments of the present invention.

In a first aspect, the present invention provides an end-block for rotatably carrying a sputtering target tube and for restraining a magnet bar inside said sputtering target tube. The end-block comprises a receptacle for receiving a magnet bar fitting. The receptacle comprises a first part of a signal connector arranged to receive a second part of a signal connector from said magnet bar fitting and allowing a signal connector between the end-block and the magnet bar to be formed. The signal connector may for example be automatically formed upon assembling the magnet bar with the end-block.

The end-block according to embodiments of the present invention is adapted for providing protection means to the signal connector for protecting it from degradation, destruction or interference of a power and/or data signal transmitted between the end-block and the magnet bar due to surrounding cooling fluid and/or due to surrounding high energy fields, e.g. having a power between 0.5 kW and 250 kW, and/or having a frequency in a range from 0 kHz to 350 kHz. It is an advantage of embodiments of this first aspect of the present invention that a signal, such as an electrical signal, an optical signal, a pneumatic or a hydraulic signal, may be transferred from the end block towards the magnet bar, or vice versa, without the integrity of the signal transmission being compromised. Depending on the type of signal to be transmitted, the first part of the signal connector may be selected, hence adapted, for transmitting that type of signal.

The signal to be transmitted may be a data signal or a power signal, or a combined data/power signal. The signal to be transmitted, be it a data signal or a power signal, may be a signal which is not intended for sustaining the sputter deposition process.

An electrical signal may be provided as the preferred solution for realizing the transfer of data and/or power of the signal connector. The signal connector in this case may be implemented as a pure and low resistive direct contact connector. However, a capacitive coupling or even inductive coupling may be used as well, and may overcome some of the problems related to electro- or chemical corrosion.

The protection means may be provided per se, e.g. by material selection, or only upon connection of the end-block and the magnet bar, e.g. in case of an enclosure being formed.

In embodiments of the present invention, the protection means includes the first part of the signal connector comprising or consisting of a non-corroding material, such as e.g. material comprising or consisting of silver or gold, or Ni-plated material, at least at its outer surface. The protection means may furthermore be made from an electrically conductive material. Selecting electrically conductive and non-corroding material for the signal connector allows the signal connector itself, more particularly the surface quality thereof, to be at least less, and preferably not, degraded by electro-chemical processes such as electro-corrosion. This allows to transmit, in a reliable way, signals, for instance electrical signals, in a highly corrosive environment formed by e.g. cooling fluid subjected to a high energy field having a high power of e.g. between 0.5 kW and 250 kW, and/or a frequency in DC, pulsed DC or mid frequent AC (e.g. ranging from 0 kHz to 350 kHz).

Alternatively or on top thereof, the protection means may include an enclosure being formed around the signal connector upon the first part in the end-block receiving the second part of the magnet bar, such that an enclosed connector is obtained. Hereto, the end-block may be provided with part of, e.g. about half of, the enclosure being formed around the connector. The magnet bar, in particular e.g. the magnet bar fitting, may then be provided with a corresponding mating part of the enclosure. The enclosure may have a plurality of implementations, for example a fluid-tight, e.g. water tight, locking tube, a spring loaded O-ring being enclosed once the magnet bar is mounted, or any other suitable type of tight fitting.

The enclosure being formed may generate a Faraday cage, so as to shield the enclosed connector from electrical fields, and/or may be made from a material with a high magnetic permeability, so as to shield the enclosed connector from magnetic fields.

In alternative embodiments of the present invention, the protection means of the end block may comprise a sacrificial and replaceable anode. The anode material may be consumed through electro-corrosion during operation of the sputtering installation of which the end-block forms part, before any electro-chemical attack on the signal connector occurs.

An end-block according to embodiments of the present invention, in view of its allowance to form a signal connector for transferring signals from the end-block to a magnet bar or vice versa, such that integrity of the signal transmission is obtained, allows amongst others accurate The first part of the signal connector may be partly or completely submerged in the cooling fluid. This cooling fluid may be subjected to a signal having a power between 0.5 kW and 250 kW. The cooling fluid may be subjected to a signal having a frequency in a range from 0 kHz to 350 kHz. The protection means allows to shield the signal connector from the power and frequency of the surrounding cooling fluid, such that the signal to be transmitted is at least less, and preferably not, distorted by the energetic field in the cooling fluid.

The first part of the signal connector may be a plug or a socket adapted for mating with a corresponding socket or plug as the second part of said signal connector on said magnet bar fitting. Such plug and socket configuration enables an automatic formation of the signal connector upon connection of the end-block and the magnet bar to one another.

In accordance with embodiments of the present invention, the receptacle may comprise a locking tube, wherein the first part of the signal connector is provided axially in the locking tube. This axially protruding part may engage with a corresponding mating part in the magnet bar. Alternatively, the receptacle may comprise a locking tube, wherein the first part of the signal connector is a protruding part, e.g. protruding radially inward, provided in the locking tube. Such protruding part in the receptacle may be adapted for engaging with a corresponding recessed part in the magnet bar fitting. Yet alternatively, the receptacle may comprise a locking tube, wherein the first part of the signal connector is an inner slot in the locking tube adapted for receiving a mating protrusion on said magnet bar fitting. The slot in the locking tube may be provided with a spring element, which may optionally be an electrically conductive spring element, for providing better contact between the first part of the signal connector and a second part of the signal connector.

In accordance with embodiments of the present invention, the first part of the signal connector may be part of any of an electrical connector, an optical connector, a pneumatic connector or a hydraulic connector.

In a second aspect, the present invention provides a magnet bar for being introduced into a cylindrical target tube of a sputtering apparatus. The magnet bar comprises a magnet bar fitting for fitting to an end-block receptacle. The magnet bar fitting comprises a second part of a signal connector arranged such that, when the magnet bar is fitted to an end-block, a signal connector for transmission of signals between the end-block and the magnet bar is formed, for example is automatically formed upon formation of the connection between the end-block and the magnet bar. The magnet bar is adapted for providing protection means to the signal connector for protecting it from degradation, destruction or interference of a power and/or data signal transmitted between the magnet bar and the end-block, due to surrounding cooling fluid and/or due to surrounding high energy fields. The signal connector may be for transmission of signals, be it data signals and/or power signals, which are not intended for sustaining the sputter deposition process.

In embodiments of the present invention, the second part of the signal connector may be part of any of an electrical connector, an optical connector, a pneumatic connector or a hydraulic connector.

The second part of the connector is selected in type (electrical, optical, pneumatic, hydraulic) so as to mate with the type of first part of the connector in the end-block. The protection means may be provided per se, e.g. in case of material selection, or only upon connection of the magnet bar with the end-block, e.g. in case of a protecting enclosure being formed.

In embodiments of the invention, the protection means includes the second part of the signal connector comprising or consisting of a non-corroding material, at least at its outer surface. Such non-corroding material may include, the invention not being limited thereto, silver, gold or nickel. The non-corroding material may for instance be a Ni-plated layer at the surface of the second part of the signal connector. The second part of the signal connector may furthermore be made from an electrically conductive material. Selecting electrically conductive and non-corroding material for the signal connector (or its outer surface) allows the signal connector itself, more particularly the surface quality thereof, to be at least less, and preferably not, degraded by elector-chemical processes such as electro-corrosion. This allows to transmit, in a reliable way, signals, for instance electrical signals, in a highly corrosive environment formed by e.g. cooling fluid subjected to a high energy field having a high power of e.g. between 0.5 kW and 250 kW, and/or a frequency in DC, pulsed DC or mid frequent AC (e.g. ranging from 0 kHz to 350 kHz).

Alternatively or on top thereof, according to embodiments of the present invention, the protection means may include an enclosure being formed around the signal connector upon the second part being fitted into the first part, such that an enclosed connector is obtained. Hereto, the magnet bar may be provided with part of, e.g. about half of, the enclosure being formed around the connector. The end-block may then be provided with a corresponding mating part of the enclosure. The enclosure may have a plurality of implementations, for example a fluid-tight, e.g. water tight, locking tube, a spring loaded O-ring being enclosed once the magnet bar is mounted on the end-block, or any other suitable type of tight fitting.

The enclosure being formed may generate a Faraday cage, so as to shield the enclosed connector from electrical fields, and/or may be made from a material with a high magnetic permeability, so as to shield the enclosed connector from magnetic fields.

In alternative embodiments of the present invention, the protection means of the magnet bar may comprise a sacrificial and replaceable anode. The anode material may be consumed through electro-corrosion during operation of the sputtering installation of which the magnet bar forms part, before any electro-chemical attack on the signal connector occurs.

An magnet bar according to embodiments of the present invention, in view of its allowance to form a signal connector for transferring signals from an end-block to the magnet bar or vice versa, such that integrity of the signal transmission is obtained, allows amongst others accurate online adjustment of magnetic field strength in a sputtering apparatus, during sputtering and without the need for removing the vacuum from the sputtering apparatus.

The second part of the signal connector may be partly or completely submerged in the cooling fluid. This cooling fluid may be subjected to a signal having a power between 0.5 kW and 250 kW. The cooling fluid may be subjected to a signal having a frequency in a range from 0 kHz to 350 kHz. The protection means allows to shield the signal connector from the power and frequency of the surrounding cooling fluid, such that the signal to be transmitted is at least less, and preferably not, distorted by the energetic field in the cooling fluid.

The second part of the signal connector may be a plug or a socket adapted to be mating with a corresponding socket or plug of a first part of the signal connector. Such plug and socket configuration enables an automatic formation of the signal connector upon connection of the end-block and the magnet bar to one another.

In a magnet bar according to embodiments of the present invention, the second part of the signal connector may be provided in or on the magnet bar fitting, for example axially. This second part may engage with a corresponding mating part in the end-block. In particular embodiments, the second part of the signal connector may be a protruding part provided on the magnet bar fitting, for example a radially outward protruding part. Such protruding part on the magnet bar fitting may be adapted for engaging with a corresponding recessed part in end-block receptacle for receiving the magnet bar fitting. Yet alternatively, the second part of the signal connector may be a slot in the magnet bar fitting adapted for receiving a mating protrusion in an end-block onto which the magnet bar is to be connected. In both embodiments where a protruding part and a recessed part come into play, such protruding and recessed parts may, at the same time as providing the signal connector between the magnet bar and the end-block, also provide features for restraining the magnet bar, for example for rotatably restraining the magnet bar.

In the particular case of the second part of the signal connector being a protruding part on or in the magnet bar connector, axially or radially, the second part of the signal connector may be an electrically conductive part. Such second part of the signal connector may be insulated from the magnet bar fitting.

A magnet bar according to embodiments of the present invention may further comprise a magnet configuration and a drive mechanism for adjusting the position of said magnet configuration. The drive mechanism may be adapted for being driven by a power signal and/or depending on a data signal received via the signal connector.

A magnet bar according to embodiments of the present invention may further comprise a sensor for generating a sensor signal representative of a position or the magnetic field strength of a magnetic configuration and adapted for transferring the sensor signal towards an end-block.

An end-block according embodiments of the first aspect of the present invention or a magnet bar according to embodiments of the second aspect of the present invention may be adapted for transmitting a signal intended to power or control a magnetic field generating or regulating system, being part of the magnet bar. It is advantageously that a power and/or data signal can be provided independently within a high power current conducting element.

In a third aspect, the present invention provides a method for adjusting a magnetic configuration of a magnet bar in a cylindrical sputtering apparatus. The method comprises transferring, from an end-block to the magnet bar or vice versa, a signal carrying data and/or power for adjusting the magnetic configuration,. The signal transferred in accordance with embodiments of the present invention is different from the signal transferred for sustaining the rotational movement of a target.

Transferring a signal may comprise transferring a signal carrying data for adjusting a magnetic configuration of the magnet bar. Alternatively or on top thereof, transferring a signal may comprise transferring a signal for providing energy to a regulating or generating system for adjusting the position or field strength of a magnetic configuration of the magnet bar or to a sensor system.

In particular embodiments of a method according to the present invention, transferring a signal may comprise transferring a signal comprising sensor data from the magnet bar to the end-block.

It is an advantage of embodiments of the present invention that they allow transmission of a power and/or data signal between an end-block and a magnet bar, in a highly corrosive and/or high energetic environment, without the integrity of the signal transmission being compromised.

It is an advantage of embodiments of the present invention that a time saving method and device are provided.

It is an advantage of embodiments of the present invention that operation costs are reduced compared to prior art solutions.

It is an advantage of embodiments of the present invention that, with a sputtering apparatus according to embodiments of the present invention, a better product may be delivered. This may be due to the fact that, in accordance with embodiments of the present invention, the reaction time may be much faster, if a deviation in the sputtered layer is noticed.

It is an additional advantage of embodiments of the present invention that, with a sputtering apparatus according to embodiments of the present invention, an optimal configuration may be easily and fastly reproduced to other sections of the sputtering apparatus. This may be due to the fact that, in accordance with the embodiments of the present invention, feedback data may be given about the exact positioning of the magnetic system allowing replication to other magnetrons in the sputtering apparatus.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1:
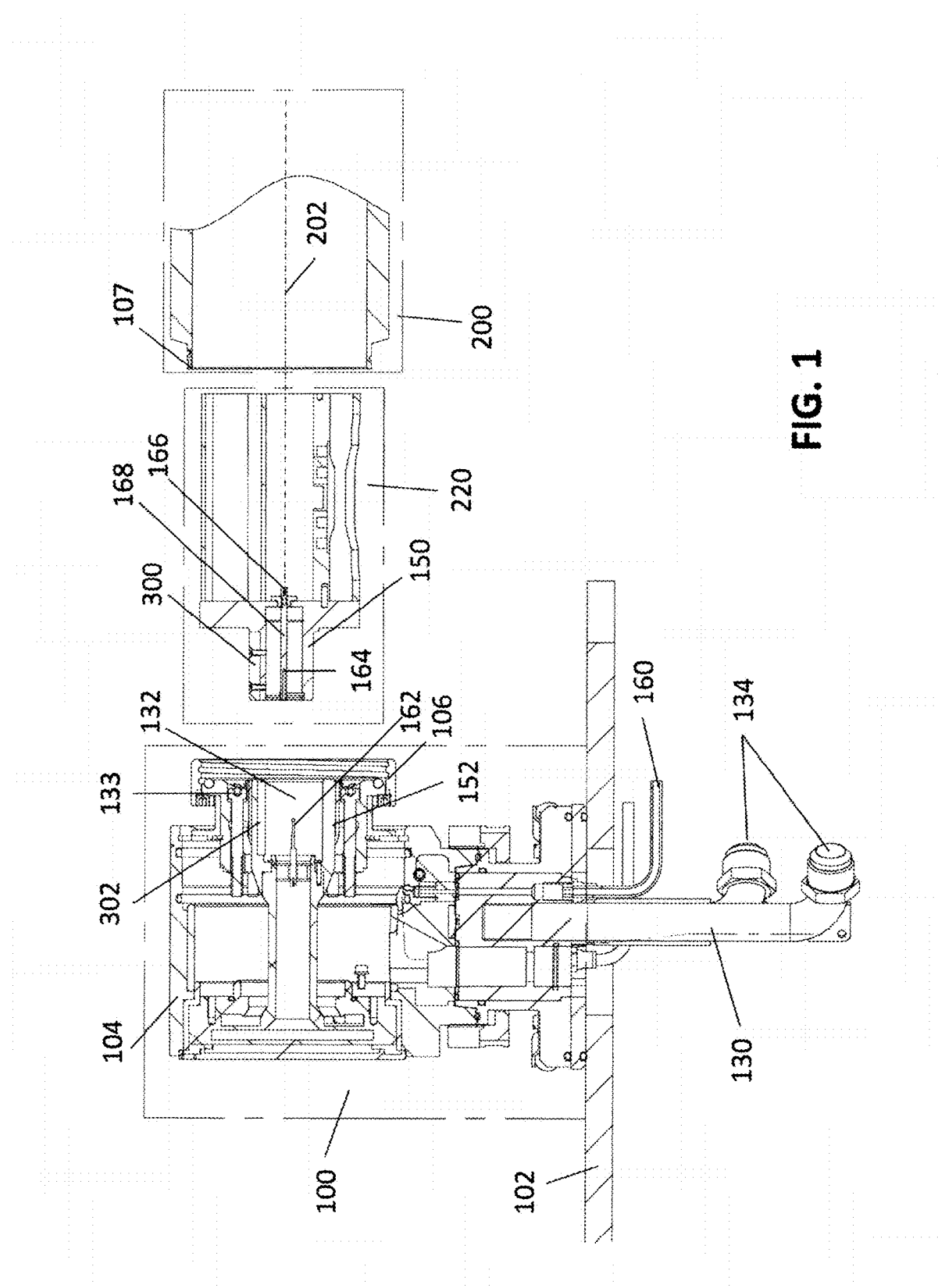
FIG. 1 is a partially exploded view of an end-block in accordance with embodiments of the present invention, a magnet bar in accordance with embodiments of the present invention, and a target tube.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing absolute positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

Within the context of the present invention, an 'end-block' is a device comprising at least one, and preferably a plurality, of the following means:

- A mechanical support system for mechanically supporting or axially aligning of the target tube and the magnet bar. The target tube may be held so as to be rotatable. The magnet bar, that is positioned inside the target, is held in a stationary position while the target tube revolves around it.
- A drive system to make the target tube rotate. This may be done by means of a worm-gear system, a cylindrical gear-gear system, a conical gear-gear crossed axis system, a pulley-belt system or any other means known in the art to make the target rotate.
- A flow system for providing a flow, e.g. a constant flow, of coolant fed into or evacuated from the target tube. A cooling fluid collector may be connected to the inside of the target tube or to a part of the magnet bar as to provide coolant flow.
- A bearing assembly. Depending on the weight of the target, more than one bearing may be necessary. A person skilled in the art will readily select that type of bearings that are appropriate from the different types known such as ball bearings, roller bearings, plain bearings, axial bearings or any other type known in the art.
- A rotatable electrical contact for providing electrical current to the target. This may be achieved by an electrical commutator equipped with brushes that are in sliding contact with a commutator ring. Instead of a brush-ring arrangement, also two rings sliding against each other can be used, or a conducting belt type of connection can be used such as a metallic belt.
- A number of rotatable coolant seals. These coolant seals ensure that coolant will not leak into the end-block or, even worse, in the vacuum apparatus while fixed and rotatable parts of an end-block turn relative to one another. In order to reduce this risk, a number of coolant seals may be introduced in cascade. Typically lip seals are used as coolant seal as they are well known in the art. However, other types, without being exhaustive, of seals like mechanical face seals or labyrinth seals are not excluded.
- A number of rotatable vacuum seals. These vacuum seals ensure the integrity of the vacuum while fixed and rotating parts of the end-block rotate relative to one another. A cascading series of vacuum seals, progressively protecting the vacuum, is particularly advantageous in order to reduce the risk of having a vacuum leak. Different seals are known of which the lip seal is most popular, although other types of new seals, such as e.g. ferrofluidic seals, can of course be used as well.

Through the end-block, rotational movement, electrical current and/or coolant might be fed to the target. Means which are removable, such as the target tube or the removable magnet bar, are considered as not to belong to the end-block.

Within the context of the present invention, a 'magnet bar' is to be understood as a device that is inserted into a target tube, and that is held by one or two end-blocks in a usually fixed position relative to the end-blocks. It comprises at least a magnetic field generator.

Within the context of the present invention, a signal connector is to be understood as a mating system of one or more connecting units allowing the transfer of at least one signal line between two devices, e.g. an end-block and a magnet bar.

In the description provided herein, numerous specific details are set forth. However, it is understood that embodiments of the invention may be practiced without these specific details. In other instances, well-known methods, structures and techniques have not been shown in detail in order not to obscure an understanding of this description.

When signal transmission, e.g. power and/or data transmission, is possible between an end-block and the internal circuitry of a magnet bar, then it is possible to provide means for controlling the magnetic properties of the magnet bar, which will assist in obtaining a homogenous coating thickness onto the substrate surface. Making an energy connection that should be disconnectable, e.g. when dismounting the magnet bar, can be realised with a connector system. For this, many manufacturers are available that offer connector-plug systems that can be used in realising this task. However, in practice, the choice of a commercially available system is not so obvious. This is explained in the following paragraphs.

The technology of industrial magnetron sputtering has already been available for a very long period, which extends over more than 20 years. Many manufacturers are available and each of these has developed his own type of end-block. These end-blocks can be compatible with each other, which means that targets from a first manufacturer can be mounted on the end blocks of a second manufacturer. An end-block is also a very expensive component and many of them can be present in an industrial coater line. In practice, because of the installed base of end-blocks, it is desirable that every existing end-block can be equipped with a magnet bar assembly that is able to perform a remote control of the magnetic field properties. This means that it is desired to be able to realise an signal connection, e.g. an energy connection, inside the end-block towards a magnet bar, within the scope of an existing end block. Some modifications are allowed, but these should not be related to a fundamental redesign of the primary functions of the end-block (see functionalities as described above).

Embodiments of the present invention provide an end-block provided with a first part of a signal connector arranged to receive a second part of a signal connector from a magnet bar fitting and allowing a signal connection between the end-block and the magnet bar to be formed. Other embodiments of the present invention provide a magnet bar provided with a second part of a signal connector arranged such that, when the magnet bar is fitted to an end-block, a signal connection for transmission of signals between the end-block and the magnet bar is formed. In accordance with embodiments of the present invention, the end-block and the magnet bar are adapted for providing protection means to the formed signal connection for protecting it from degradation, destruction or interference of a power and/or data signal transmitted between the end-block and the magnet bar due to surrounding cooling fluid and/or due to surrounding high energy fields.

One property of an energy connection in accordance with embodiments of the present invention is that it is disconnectable in an easy way. This is advantageous in view of the way that the magnet bar and the target are mounted onto the end block in a real cathode. The inventor has found that using a directly connected and isolated energy line is in practice an unacceptable solution, as the line should be cut each time. Therefore, in accordance with embodiments of the present invention, a connector system is used that gives a reliable connection of the power and/or data signals towards the equipment in the magnet bar assembly.

In embodiments of the present invention an energy connection may be made in the cooling liquid channel that provides the magnet bar with fresh cooling liquid. This allows re-using of existing end-blocks. Making an energy connection in the cooling liquid channel includes placing a connector system inside this cooling liquid channel, the connector system being adapted for connecting onto a fixed plug that is installed with a cooling liquid closed connection onto a construction wall of the magnet bar chassis. This solution is possible from a mechanical point of view.

Such connector system used in embodiments of the present invention has the following features and advantages:

The connection is made automatically when inserting the fitting of the magnet bar into the end block. In order to make an automatic connection in accordance with embodiments of the present invention, two fixed mating connector parts are used. In embodiments of the present invention, one thereof is installed fixed on the end block, one is installed fixed on the magnet bar, and when the fitting of the magnet bar is inserted into the end-block, then both connector parts will mate and realise the energy connection. In this way, the cable connection towards the fixed connector, mounted onto the end block, and the outside world connector, can be kept short, fixed and sufficiently stiff to prevent any interaction with the turbulent properties of the cooling liquid flow. This avoids the need for the connector to be reachable with the human hand, which would require the use of a long cable. The use of a long cable that can be pulled out of the cooling water pipe, so that it becomes reachable for the human hand in order to make a connection onto the magnet bar proves to show severe drawbacks, which are overcome by the connection being made in accordance with embodiments of the present invention. The cable has to be pushed back into the water tube during subsequent mounting of the magnet bar and this is not obvious, even not feasible. The long cable can be dragged along by the cooling fluid flow and this might severely obstruct the cooling fluid flow due to movement of the cable towards any exit opening. Another disadvantage of using a long cable that can be retracted from the cooling water pipe during assembly of the magnet bar is the interaction of the cable with the cooling liquid flow. When the thickness of this cable has been limited in order to prevent any obstruction of the cooling liquid flow in the existing water tube, then it might be expected to be a cable that can be bended much more easily than a thick cable. In practice, due to the high cooling demand in the target (energy dissipation of up to 250 kW), a high flow rate is imposed and this high flow rate is accompanied automatically with a turbulent flow pattern. This turbulent flow pattern will interact with the cable and it will impose time dependent drag forces on the cable. When the energy cable is thin, it will move around in the cooling liquid and the cable insulation will be damaged by interaction with the internal walls in the end-block. Practice shows that thick cables should be used in order to prevent too much interaction with the turbulent flow of the cooling liquid. Having to retract a cable & plug from the cooling water system in order to make the connection by hand is in that case merely impossible.

The first and second parts of the signal connector, forming a signal connection in accordance with embodiments of the present invention, avoids a large obstruction of the cooling liquid flow which would take place when inserting cabling and connectors in the cooling water system. Due to the high cooling water demand in the end-block and the target, such obstruction is not desirable. In embodiments of the present invention, the first and second parts of the signal connector may be kept as small as possible in order to not obscure the cooling water flow. In practice, a commercial connector that is fully enclosed against water and that shows small dimensions cannot be found.

In practice, during operation of the coater including an end-block and a magnet bar according to embodiments of the present invention, the formed connector system will be fully submerged in the cooling liquid flow. For this, in accordance with embodiments of the present invention, protection means are provided, e.g. a fluid closed connector is provided, that will provide electrical isolation between the mating contacts and the cooling liquid. The cooling liquid can be composed based on water and based on oil. When being based on oil, then the cooling liquid presents itself as an electrical isolator and will not interact when a galvanic contact is made with any of the metals parts used in providing power and signal data towards the sub-circuits present in the magnet block. But the use of an oil based cooling liquid represents only 1% of all industrial installations. The bulk of cooling liquid used is based on water. The advantages of water with regard to cooling properties are important: (a) water has a high specific heat and can carry therefore a lot of thermal energy and (b) water has a rather low viscosity, allowing for a high fluid speed and hence, refreshment of the cooling liquid on the internal surface of the target material, that is dissipating power in the range of 0.5 to 250 kW. In practice, the electrical conductivity of this cooling water can be rather high, due to electrochemical pollution of this cooling fluid with all kind of metals, present in a magnetron system and the high voltages that are present between the different targets, work as a driving force for this electrochemical corrosion and this will inject ions into the water, increasing its conductivity. Conditioning of the cooling liquid using inhibitors, is mandatory according to the manual of the manufacturer of various system components in a magnetron system, but the real world situation can be different! Hence in realistic systems the cooling liquid has conducting properties. A problem arises when a target and magnet bar are being dismounted from an end-block. In practice, one needs to evacuate the cooling liquid before the magnet bar fitting is pulled from the end-block. For this, mostly compressed air may be used that is flushed through-out the cooling liquid system that comprises the end-block, the magnet bar and the interior of the target. But in practice, this procedure is not always followed and it is possible that a magnet bar fitting is pulled from the end-block, when cooling liquid is still present. The energy connector will un-mate and they will be flood with cooling liquid. Therefore, in accordance with embodiments of the present invention, even a water closed connector should preferably be robust to full insertion into the cooling liquid. Cooling liquid can stay inside the connector and after re-mating and applying power, an undesirable situation can occur, if no protection means would be provided at the inside of the connector. Many tests during prototyping have shown that the connector gets polluted with water and this can give a tremendous effect of corrosion inside the connector, especially when electrical energy is being used, showing a major reliability problem. Hence, in accordance with embodiments of the present invention, protection means are provided, not only at the outside but also at the inside of the first and second connector parts.

Embodiments of the present invention show the following advantages:

The provided protection means prevent Use and wear of the connector with typical process conditions in a magnetron environment to ultimately give a galvanic contact between internal parts of the energy connector system and the cooling liquid. When this happens anyway, due to the protection means being provided the chemical corrosion is limited as much as possible. Also due to the protection means, when electrical energy is being transferred through the connector, then electrochemical corrosion is limited as much as possible.

The connector system is small in size, so that it does not hydro-dynamically obscure the cooling liquid flow too much.

The protected, e.g. cooling liquid closed connector, can be submerged into the cooling liquid. The interior of the connector parts may be wetted, and the connector parts may be mated shortly after this event.

The mating parts of the connector may be fixed on end-block and magnet bar. Provision of a first part of the signal connector on the end block, with protection means, may be possible onto a plurality of end-blocks, possibly on every existing end-block in the field.

A connector system in accordance with embodiments of the present invention, provided on an end-block and/or a magnet bar, showed itself to be sufficiently robust in order to function in the constraints of a magnetron system.

In embodiments of the present invention, the protection means may include the parts of the formed signal connector comprising or consisting of an electrically conductive and non-corroding material, at least at its outer surface. The protection means may include an enclosure being formed around the signal connector upon the first part and the second part being connected. In alternative embodiments, the protection means may comprise a sacrificial and replaceable anode that may be consumed through electro-corrosion before any electro-chemical attack on the signal connector occurs.

In what follows, particular embodiments of end-blocks and magnet bars in accordance with embodiments of the present invention are described and illustrated.

FIG. 1 shows as schematic drawing of a first embodiment of an end-block 100 according to embodiments of the present invention of a sputtering device. The end-block 100 illustrated is mounted on a base plate 102.

In accordance with embodiments of the present invention, an end-block 100 illustrated in FIG. 1 comprises, on top of the at least one of the hereinabove cited means for performing the function(s) of an end-block, an electrical contact for providing electrical current (data and/or power) from the end-block to the magnet bar or vice versa. In alternative embodiments, not illustrated, the end-block may comprise, on top of the at least one of the cited means, another type of contact (other than electrical) for providing a power and/or data signal from the end-block to the magnet bar or vice versa.

The end-block 100 according to embodiments of the present invention comprises a housing 104. In the embodiment illustrated, the housing 104 is fixedly mounted to the base plate 102 of a coater. The base plate 102 is a structural component defining a leak tight sputtering apparatus in which a vacuum can be sustained. In many cases, the base plate 102 is part of a wall, a door, a flange or a lid of the sputtering apparatus.

A target 200 may be rotatably mountable onto the end-block 100, such that it is able to rotate around its axis of rotation 202. The target 200 may hereto be connected to a holder ring 106 by means of a connector 107.

In operation, the target 200 may be rotationally driven by any suitable system (not illustrated in FIG. 1). During operation, as sputtering of the target generally generates a lot of heat on the target surface, the target must be cooled. This may typically be done with water or any other suitable coolant fluid. This coolant must be fed to and evacuated from the target tube 200 through the end-block 100. Coolant fluid is supplied to the target tube 200 by means of coolant supply tube 130 and coolant feed tube 132. Coolant fluid is extracted via coolant openings 133. The end-block 100 has cavities 134 for feeding and extracting coolant fluid.

The magnet bar 220 is held stationary through a fitting 150 that locks into a corresponding locking part such as a locking tube 152 that is fixedly connected inside the end-block 100.

In accordance with embodiments of the present invention, the end-block 100 comprises means for providing a connection between the end-block 100 and the magnet bar 220, the connection being adapted for transmission of signals between the end-block 100 and the magnet bar 220. The transmission of the signals may be two-way transmission, i.e. transmission from the end-block 100 towards the magnet bar 220 and/or transmission from the magnet bar 220 toward the end-block 100. The signals to be transmitted from end-block 100 to magnet bar 220 or vice versa may be power signals and/or data signals. The signals to be transmitted may be any type of signals which can transfer energy or information, such as for example but not limited thereto electrical signals, optical signals, pneumatic or hydraulic signals. The means for providing a connection between the end-block 100 and the magnet bar 220 may be a first part 162 of a signal connector arranged to receive a second part 164 of a signal connector from the magnet bar 220, the first part 162 and the second part 164 together forming, when being united, a signal connector between the end-block and the magnet bar.

In particular embodiments of the present invention, the end-block 100 comprises means for providing a connection between the end-block 100 and the magnet bar 220 for transferring an optical signal between both. The optical signal may be a data signal. The connection may comprise a first part on the end-block 100, and a second part on the magnet bar 220, whereby any of the first and second parts is a source of optical signals, such as a light source, e.g. a laser, a LED, a diode, and the other one of the first and second parts is an optically sensitive element. The first part on the end-block 100 and the second part on the magnet bar 220 are physically laid out such that when the magnet bar 220 is coupled to the end-block 100, an optical coupling between both is automatically formed. Hereto the first part and the second part must be arranged such that the optically sensitive element can 'see' the optical signal emitted by the source of optical signals.

In alternative embodiments of the present invention, the end-block 100 comprises means for providing a connection between the end-block 100 and the magnet bar 220 for transferring a pneumatic or hydraulic signal between both. The pneumatic or hydraulic signal may be a power signal. The connection may comprise a first part on the end-block 100, and a second part on the magnet bar 220, whereby any of the first and second parts is a source of signals in the form of pressurised gas or fluid, and the other one of the first and second parts is a pressure sensitive element for transferring received pressure onto something else. The first part on the end-block 100 and the second part on the magnet bar 220 are physically laid out such that when the magnet bar 220 is coupled to the end-block 100, a pneumatic coupling between both is automatically formed.

In yet other embodiments of the present invention, the end-block 100 comprises means for providing an electrical connection between the magnet bar 220 and the end-block 100. The electrical connection can be for data or power signals or for both. Hence, via the electrical connection between the end-block 100 and the magnet bar 220 in accordance with embodiments of the present invention, either the magnet bar 220 can be actuated, or data signals can be transmitted to and/or from the outside world, i.e. outside the vacuum or low pressure environment, while maintaining the low pressure inside the sputtering apparatus and/or while maintaining cooling fluid inside the target tube 200.

The end-block 100 is further adapted for providing protection means to the signal connector to be formed by the first part 162 and the second part 164, for protecting it from degradation, destruction and/or interference of a power and/or data signal transmitted between the end-block 100 and the magnet bar 220 due to surrounding fluid and/ due to surrounding high energy fields.

In the embodiment illustrated in FIG. 1, the present invention not being limited thereto, the protection means includes the first part 162 of the signal connector comprising or consisting of an electrically conductive and non-corroding material. Such material may for example be silver, gold or nickel. Such non-corroding material may be applied only to the outer surface of the first part 162 of the signal connector. Due to the protection means a signal may be transferred from the end block towards the magnet bar, or vice versa, without the integrity of the signal transmission being compromised due to the surrounding cooling fluid and/or the surrounding high energy fields.

Selecting electrically conductive and non-corroding material for the first part 162 of the signal connector (or its outer surface) allows the signal connector itself, more particularly the surface quality thereof, to be at least less, and preferably not, degraded by elector-chemical processes such as electro-corrosion. This allows to transmit, in a reliable way, signals, for instance electrical signals, in a highly corrosive environment formed by e.g. cooling fluid subjected to a high energy field having a high power of e.g. between 0.5 kW and 250 kW, and/or a frequency in DC, pulsed DC or mid frequent AC (e.g. ranging from 0 kHz to 350 kHz).

FIG. 1 also schematically illustrates a magnet bar coupling element 300 attached to the magnet bar fitting 150 for being connected to, e.g. inserted into the locking tube 152 of a an end-block 100 in accordance with embodiments of the present invention. The locking tube 152 may therefore be provided with a slot 302 into which the magnet bar coupling element 300 as a protrusion on the magnet bar fitting 150 may fit, e.g. may slidingly fit, so as to prevent rotation of the magnet bar 220 inside the target tube 200. In an alternative embodiment, the locking tube 152 may be provided with a key (not illustrated) to fit into and align with a slot on the magnet bar fitting 150 so as to align the magnet bar 220 and prevent rotation thereof. In yet alternative embodiments, not illustrated in the drawings, a plurality of magnet bar coupling elements 300 may be provided on the magnet bar fitting 150, and a plurality of corresponding mating slots 302 may be providing in the locking tube 152. Or the locking tube 152 may be provided with a plurality of keys, each arranged to fit into and align with a corresponding mating slot on the magnet bar fitting 150.

In embodiments of the present invention, a new type of functionality is brought to the magnet bar 220, namely a signal, such as a power signal or a data signal or a combined power-data signal, is provided to this magnet bar 220. Hereto, the magnet bar 220 is provided with a second part 168 of a signal connector arranged such that, when the magnet bar is fitted to an end-block 100, a signal connector for transmission of signals between the end-block 100 and the magnet bar 220 is formed. The signal may for example be an electrical signal, an optical signal, a pneumatic signal, or any other suitable type of signal able to transfer energy. Such signal may either be provided outside the magnet bar 220 and applied thereto, or may be generated in the magnet bar 220 and brought to the outside world.

The magnet bar is adapted for providing protection means to the signal connector of protecting it from degradation, destruction or interference of the power and/or data signal transmitted between the magnet bar 220 and the end-block 100 due to surrounding cooling fluid and/or due to surrounding high energy fields.

In the embodiment illustrated in FIG. 1, the present invention not being limited thereto, the protection means includes the second part 168 of the signal connector comprising or consisting of an electrically conductive and non-corroding material. Such material may for example be silver, gold or nickel. Such non-corroding material may be applied only to the outer surface of the second part 168 of the signal connector. Due to the protection means a signal may be transferred from the end block towards the magnet bar, or vice versa, without the integrity of the signal transmission being compromised due to the surrounding cooling fluid and/or the surrounding high energy fields.

Selecting electrically conductive and non-corroding material for the second part 168 of the signal connector (or its outer surface) allows the signal connector itself, more particularly the surface quality thereof, to be at least less, and preferably not, degraded by elector-chemical processes such as electro-corrosion. This allows to transmit, in a reliable way, signals, for instance electrical signals, in a highly corrosive environment formed by e.g. cooling fluid subjected to a high energy field having a high power of e.g. between 0.5 kW and 250 kW, and/or a frequency in DC, pulsed DC or mid frequent AC (e.g. ranging from 0 kHz to 350 kHz).

In the following, a particular embodiment is described, where the signal is an electrical signal. This, however, is not intended to be limiting for the present invention. In such case, an electrical connector for making an electrical connection between the magnet bar 220 and the end block 100 is provided. In the embodiment illustrated in FIG. 1, the electrical connection is formed by a first part 162 of an electrical connector on the end block 100, adapted for electrically connecting to a mating electrical connection piece 164 on the magnet bar. The first part 162 of the electrical connector may protrude inside the locking tube 152, and snugly fit into a mating hole such as a bore hole in an electrically conductive piece 168 in the magnet bar fitting 150.

Figure 2:
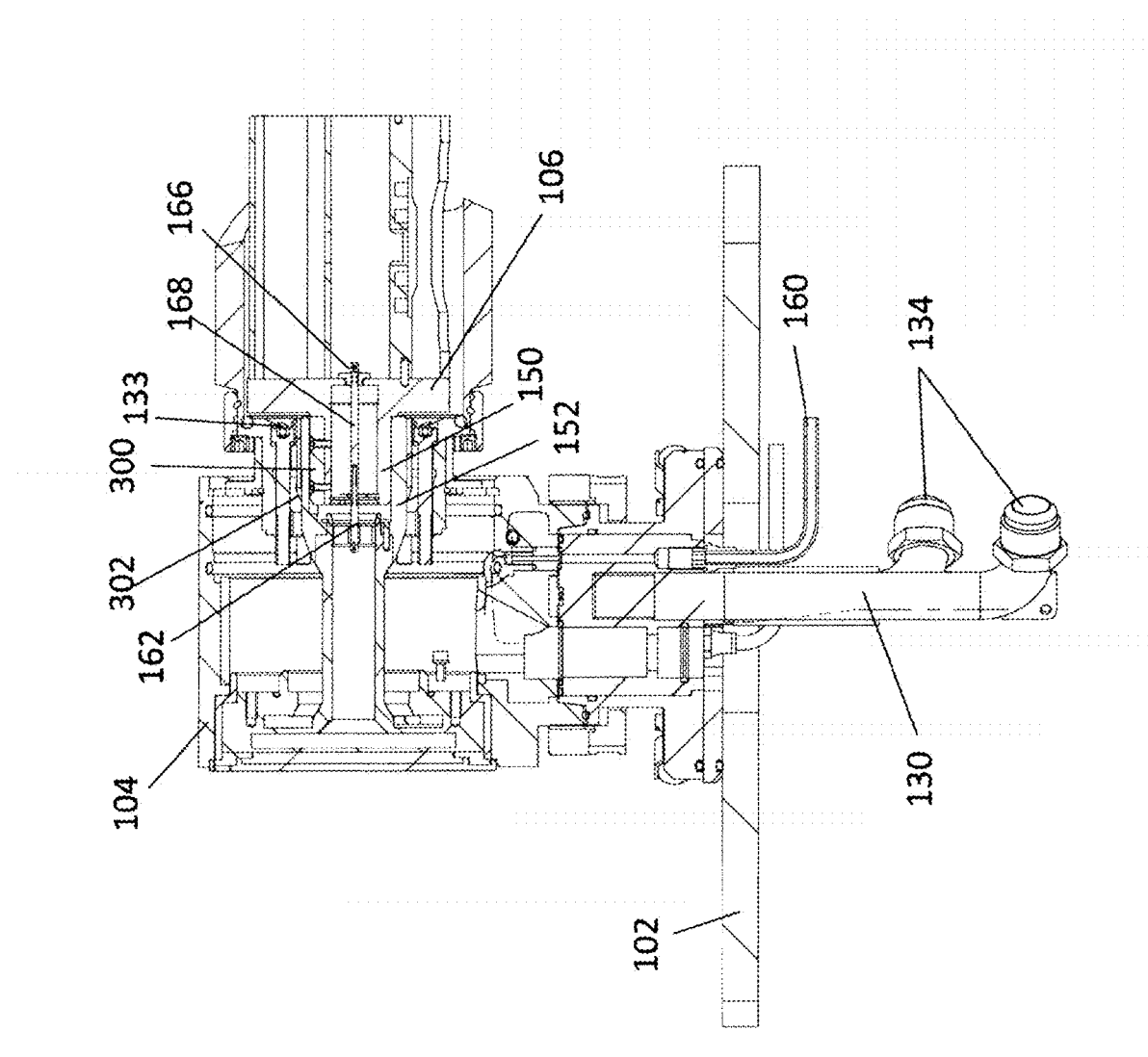
FIG. 2 is a schematic illustration of an assembly of the components illustrated in FIG. 1.

From outside the vacuum, an electrical signal such as a data signal and/or power may be provided on a connector 160. The end-block 100 is adapted for providing an electrical path(not completely visible in FIG. 1) from the connector 160 to the first part 162 of the electrical connection. When pieces are assembled so as to form a completed assembly as in FIG. 2, the electrical path continues, via the 1$^{st}$ part 162 of the electrical connection, over the electrically conductive piece 168 in the magnet bar fitting 150, up to an end connector 166 on the electrically conductive piece 168. The end connector 166 is adapted for being connected to an electrical wire for providing an electrical signal to a part of the magnet bar, or for obtaining an electrical signal from a part of the magnet bar.

In accordance with embodiments of the present invention, the electrical signal can be a signal for commanding a magnetic configuration locally or as a whole inside the magnet bar 220. The preferred purpose of providing a signal between the end block and the magnet bar may lie in powering, adjusting or controlling a magnetic field generating or regulating system that is located inside the magnet bar. This may be particularly useful if for example the coating applied by the sputtering device is found to be non-uniform. Such non-uniformities may be solved by locally, at the level of the non-uniformity, changing the sputtering speed. Such change in sputtering speed may be obtained by changing the magnetic field strength; e.g. by moving or tuning the magnetic configuration towards or away from the target tube 200 or by changing the current in coils forming an electromagnet. By providing the data signal for controlling the movement of the magnetic configuration from the outside world towards the target tube 200, down time of the apparatus is minimised, as, contrary to prior art solutions, the vacuum does not need to be removed neither needs cooling fluid to be removed, nor does the target need to be removed for changing the magnetic field strength by changing the magnet configuration.

In accordance with embodiments of the present invention, the electrical signal can be a data signal obtained from a sensor unit inside the magnet bar 220, providing feedback from a current magnetic configuration or local position of the magnets to the outside world. Such sensor signal can be used for controlling a control unit for changing the location of the magnetic configuration. It is an advantage of the present embodiments of the invention that the exact position of the magnetic configuration inside the magnet bar 220 can be measured without having to open the magnet bar, hence without having to remove the vacuum. The sensor signal providing information about the exact positioning or strength of the magnetic system can be used for replication to other magnetrons in the sputtering apparatus. As an example only, if a sputtering apparatus comprises a plurality of magnet bars, these should preferably have similar settings. In accordance with embodiments of the present invention, the sputtering device can be brought under vacuum, and one of the magnet bars can be adjusted online, i.e. without having to remove the vacuum. Sensor signals providing information about the actual setting of the magnetic configuration of that single magnet bar may be obtained; in accordance with embodiments of the present invention via the connection between the end-block 100 and the magnet bar 220 adapted for transferring signals. Once optimal settings for the particular magnet bar are derived, the vacuum can be broken, and the obtained data signals can be used for adjusting, manually or in an automated way, the magnetic configurations of the other magnet bars in the sputtering device.

In accordance with embodiments of the present invention, the electrical signal can be an electrical signal for providing energy to a regulating mechanism, such as a control unit for adjusting the position of the magnetic configuration, e.g. a motor, or such as a coil of an electromagnet for adjusting the magnetic field strength or to a sensor system, such as a sensor unit for determining the current magnetic configuration.

In accordance with embodiments of the present invention, the electrical signal may be a combined power-data signal, for simultaneously transferring data and power from or to the magnet bar 220. As an example, a power signal, such as an AC power signal, may be provided from the end-block 100 to the magnet bar 220, and a data signal may be superposed onto the power signal. The combined power-data signal received by the magnet bar 220 may then be split into a data signal for commanding a magnetic configuration inside the magnet bar 220 and a power signal for providing energy to a regulating mechanism for adjusting the position of the magnetic configuration. In the embodiment described above with respect to FIG. 1, the electrical connection between the end-block 100 and the magnet bar fitting 150 is provided axially, by means of the first part 162 of the electrical connection and electrically conductive piece 168 having a mating electrical connection piece 164.

Figure 3:
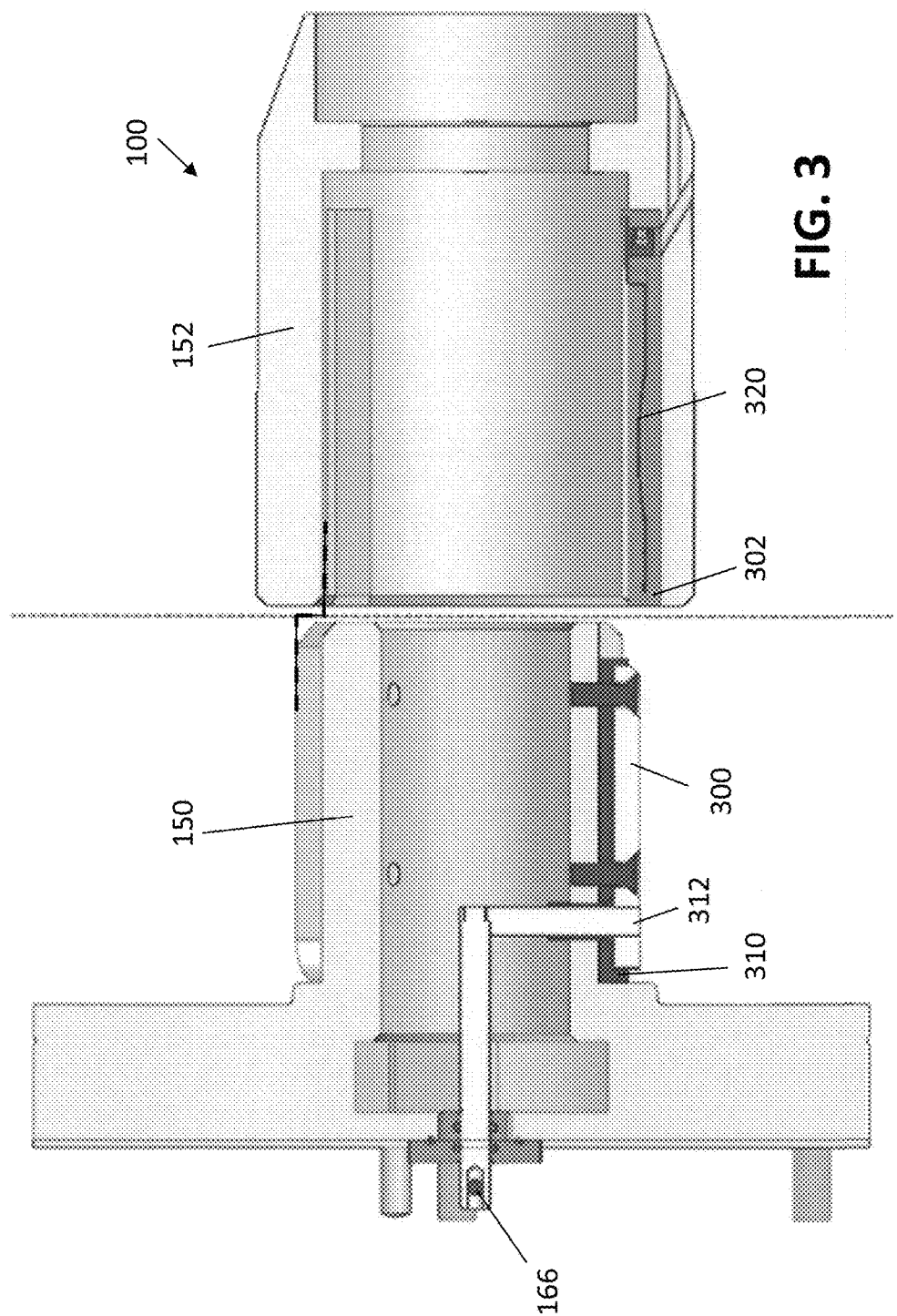
FIG. 3 is a schematic illustration of a magnet bar coupling for being inserted into an end-block in accordance with embodiments of the present invention.
Figure 4:
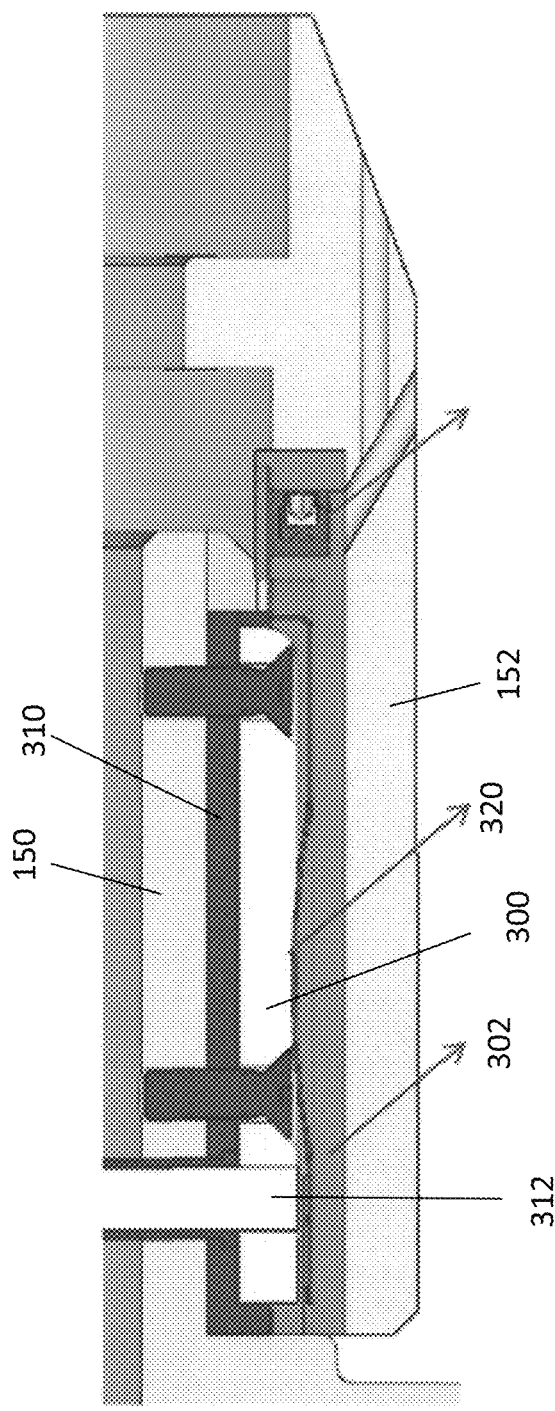
FIG. 4 is a schematic illustration of part of an assembly of a magnet bar and an end-block as in FIG. 3.

In alternative embodiments, as illustrated in FIG. 3 and FIG. 4, the connection can be formed by a more generic interaction between the magnet bar fitting 150 and the locking tube 152 of the end-block 100. Hereto, as an example only, a protrusion on the magnet bar fitting 150, which may be but does not need to be the magnet bar coupling element 300, may be made of conductive material, and may be insulated from the magnet bar fitting 150 by means of an insulating piece 310. An electrically conductive piece 312 may then be provided, inside the magnet bar fitting 150, electrically connecting the protrusion such as the magnet bar coupling element 300 to the end connector 166. At the side of the end-block 100, the locking tube 152 functioning as a receptacle adapted for receiving the magnet bar fitting 150 may be provided with a mating slot 302 for receiving the protrusion, e.g. magnet bar coupling element 300. This mating slot may be made in electrically conductive material, but preferably, as illustrated in FIG. 3 and FIG. 4, the mating slot 302 may be made in insulating material and provided with at least an electrically conductive layer. The electrically conductive layer may be a covering layer, such as a gold plated layer, covering the surface of the insulating material. Alternatively, the electrically conductive layer may be implemented as a spring element 320, which provides a firm electrical contact between the end-block 100 and the magnet bar 220 when both are connected to one another. The use of gold plated material as the electrically conductive material is advantageous in that it suffers less from corrosion than some other materials. In both cases, the electrically conductive part forming the mating slot may be coupled to an electrical path for transmitting electrical signals to and from the magnet bar 220. In alternative embodiments, not illustrated in the drawings, the protruding piece may be provided in the locking tube of the end block, and the mating slot with conductive material, e.g. in the form of a conductive spring, may be provided in the magnet bar fitting.

It is an advantage of embodiments of the present invention that a connection between the end-block 100 and the magnet bar fitting 150 is made automatically by connecting one to the other.

It may be clear for a person skilled in the art that the connection between the end-block 100 and the magnet bar 220, which is adapted for transmission of signals between the end-block 100 and the magnet bar 220, may be provided in a wet environment. In particular embodiments, the connection adapted for transmission of signals between the end-block 100 and the magnet bar 220 may for example be provided in the coolant tube 132. The coolant flowing through the coolant tube is held at a high potential; typically between −200V and—1000V both in DC and AC operation. Placing electrical signals on conductive material in a wet environment typically is very corrosive and should require special precautions to sustain the integrity of the connection. In view of corrosion it is advantageous to use connections between end-block 100 and magnet bar 220 which are adapted for transferring energy via other principles, e.g. optical connections, pneumatic or hydraulic connections.

Based on practical experience while using an electrical connection, the cooling liquid will in the end always make galvanic contact with the central conductor formed by the first and second parts 162, 168. Despite installing protections, mechanical damage to the protection system may occur due to the way that the first part 162 must be mounted in an existing system. Here it is advantageous to provide provision, in accordance with embodiments of the present invention, that the cooling liquid is excluded from the internal contact that exists between the first part 162 and the second part 168. However, due to constraints of construction and mounting, there will never be 100% full protection against the first part 162 or the second part 168 making contact with the cooling liquid. When the first part 162 or the second part 168 make contact with the cooling liquid, a current path through the cooling liquid can be formed towards the fitting 150 or 152. This typically would be a source of electrochemical corrosion and hence, pose a reliability problem on the connector system. But as part of this invention, a solution has been found for this problem. Some constraints may be imposed on the voltage system that will be used in providing power and signal data towards the interior of the magnet bar. The outside world should provide this power and signal data onto the central conductor 162 and the return conductor 152.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

The invention claimed is:

1. An end-block for rotatably carrying a sputtering target tube and for restraining a magnetic system comprising a magnet bar inside said sputtering target tube, said end-block comprising a receptacle for receiving a magnet bar fitting, wherein said receptacle comprises a first part of a signal connector arranged to receive a second part of a signal connector from said magnet bar fitting when mounting the magnet bar fitting into the end block, thereby allowing a signal connection between the end-block and the magnet bar to be formed, the end-block being adapted for providing protection means to the signal connector for protecting it from degradation, destruction or interference of a power and/or data signal transmitted between the end-block and the magnet bar due to surrounding cooling fluid and/or due to surrounding high energy fields, wherein the end-block is adapted for controlling the magnetic system using the power and/or data signal over the signal connector and/or for receiving sensor data from the magnetic system over the signal connector.

2. An end-block according to claim 1, wherein the first part of the signal connector is adapted for transmitting an electrical power and/or data signal.

3. An end-block according to claim 1, wherein the protection means includes the first part of the signal connector comprising an electrically conductive and non-corroding material, at least at its outer surface.

4. An end-block according to claim 1, wherein the protection means includes an enclosure formed around the signal connector upon the first part receiving the second part.

5. An end-block according to claim 4, wherein the enclosure being formed generates a Faraday cage.

6. An end-block according to claim 4, wherein the enclosure being formed is made from a material having a sufficiently high magnetic permeability so as to shield the enclosed connector from a magnetic field.

7. An end-block according to claim 1, wherein the protection means comprises a sacrificial and replaceable anode, that is consumable through electro-corrosion before any electro-chemical attack on the signal connector occurs.

8. An end-block according to claim 1, wherein the first part is partly or completely submerged in the cooling fluid.

9. An end-block according to claim 1, wherein the protection means is adapted for protecting the signal connector from degradation, destruction or interference of a power and/or a data signal due to the surrounding cooling fluid being subjected to a signal having a power between 0.5 kW and 250 kW.

10. An end-block according to claim 1, wherein the protection means is adapted for protecting the signal connector from degradation, destruction or interference of a power and/or a data signal due to the surrounding cooling fluid being subjected to a signal having a frequency in a range from 0 kHz to 350 kHz, optionally pulsed.

11. A magnet bar for being introduced into a cylindrical target tube of a sputtering apparatus, the magnet bar comprising a magnet bar fitting for fitting to an end-block receptacle of an end-block wherein said receptacle comprises a first part of a signal connector, wherein said magnet bar fitting comprises a second part of the signal connector arranged such that, when the magnet bar is fitted to the end-block, the first part of the signal connector receives the second part of the signal connector thereby allowing a signal connection between the end-block and the magnet bar to be formed, the magnet bar being adapted for providing protection means to the signal connector for protecting it from degradation, destruction or interference of a power and/or data signal transmitted between the magnet bar and the end-block due to surrounding cooling fluid and/or due to surrounding high energy fields, wherein the magnet bar is adapted for controlling its magnetic properties using the power and/or data signal received from the end block and transmitted over the signal connector and/or for transferring sensor data from the magnet bar to the end block over the signal connector.

12. A magnet bar according to claim 11, wherein the second part of the signal connector is adapted for transmitting an electrical power and/or data signal.

13. A magnet bar according to claim 11, wherein the protection means includes the second part of the signal connector comprising an electrically conductive and non-corroding material, at least at its outer surface.

14. A magnet bar according to claim 11, wherein the protection means includes an enclosure being formed around the signal connector upon the second part being fitted into the first part.

15. A magnet bar according to claim 14, wherein the enclosure being formed generates a Faraday cage.

16. A magnet bar according to claim 14, wherein the enclosure being formed is made from a material having a sufficiently high magnetic permeability so as to shield the enclosed connector from a magnetic field.

17. A magnet bar according to claim 11, wherein the protection means comprises a sacrificial and replaceable anode, that is consumable through electro-corrosion before any electro-chemical attack on the signal connector occurs.

18. A magnet bar according to claim 11, wherein the second part is partly or completely submerged in the cooling fluid.

19. A magnet bar according to claim 11, wherein the protection means is adapted for protecting the signal connector from degradation, destruction or interference of a power and/or a data signal due to the surrounding cooling fluid being subjected to a signal having a power between 0.5 kW and 250 kW.

20. A magnet bar according to claim 11, wherein the protection means is adapted for protecting the signal connector from degradation, destruction or interference of a power and/or a data signal due to the surrounding cooling fluid being subjected to a signal having a frequency in a range from 0 kHz to 350 kHz, optionally pulsed.

21. The magnet bar according to claim 11, the second part of the signal connector being an electrically conductive part, wherein the second part of the signal connector is insulated from the magnet bar fitting.

22. The magnet bar according to claim 11, further comprising a magnet configuration and a drive mechanism for adjusting the position of said magnet configuration, the drive mechanism being adapted for being driven by a power signal and/or depending on a data signal received via the signal connector.

23. The magnet bar according to claim 11, further comprising a sensor for generating a sensor signal representative of a position or the magnetic field strength of a magnetic configuration and adapted for transferring the sensor signal towards an end-block.

24. An end-block according to claim 1, adapted for transmitting a signal intended to power or control a magnetic field generating or regulating system, being part of the magnet bar.

25. A magnet bar according to claim 11, adapted for transmitting a signal intended to power or control a magnetic field generating or regulating system, being part of the magnet bar.

* * * * *